United States Patent [19]
Jahanghir

[11] Patent Number: 5,996,103
[45] Date of Patent: Nov. 30, 1999

[54] APPARATUS AND METHOD FOR CORRECTING ERRORS IN A COMMUNICATION SYSTEM

[75] Inventor: Musa Jahanghir, Hayward, Calif.

[73] Assignee: Samsung Information Systems America, San Jose, Calif.

[21] Appl. No.: 08/688,891

[22] Filed: Jul. 31, 1996

[51] Int. Cl.⁶ .................. H03M 13/00; H03M 13/12; H03M 13/22
[52] U.S. Cl. ................... 714/755; 714/761; 714/780
[58] Field of Search .................. 371/37.4; 714/755, 714/761, 780

[56] References Cited

U.S. PATENT DOCUMENTS

| | | | |
|---|---|---|---|
| 4,928,288 | 5/1990 | D'Aria et al. | 375/17 |
| 5,023,889 | 6/1991 | Divsalar et al. | 375/27 |
| 5,113,400 | 5/1992 | Gould et al. | 371/43 |
| 5,181,209 | 1/1993 | Hagenauer et al. | 371/43 |
| 5,416,804 | 5/1995 | Khaled et al. | 375/341 |
| 5,420,640 | 5/1995 | Munich | 348/525 |
| 5,438,590 | 8/1995 | Tzukerman et al. | 375/259 |
| 5,457,704 | 10/1995 | Hoeher et al. | 371/43 |
| 5,504,816 | 4/1996 | Hamilton | 380/20 |
| 5,511,081 | 4/1996 | Hagenauer | 371/43 |
| 5,625,624 | 4/1997 | Rosen | 370/307 |
| 5,671,253 | 9/1997 | Stewart | 375/316 |

Primary Examiner—Stephen M. Baker
Attorney, Agent, or Firm—Kenneth L. Sherman, Esq.; Sherman & Sherman

[57] ABSTRACT

An error correction arrangement that contains a Viterbi decoder and an RS decoder to provide inner and outer code decoding, respectively. A score keeper is arranged at the output of the Viterbi decoder to form a score for a decoded byte to indicate the number of error bits in the byte. A tie breaker is provided to compare the score with a preset threshold level. If the score is higher than the threshold level, the corresponding error byte is replaced with an erasure supplied to the RS decoder.

20 Claims, 3 Drawing Sheets

APPARATUS AND METHOD FOR CORRECTING ERRORS IN A COMMUNICATION SYSTEM

TECHNICAL FIELD

The present invention relates to error-correcting coding used in digital satellite communications, and more particularly, to an error correction system that implements Reed-Solomon (RS) coding and the Viterbi algorithm.

BACKGROUND ART

Since a communication channel is subject to various types of noise, distortion, and interference, the output of the channel tends to differ from its input. Error-correcting coding is employed in digital communications systems to reduce the average probability of errors that occur during data transmission. For example, a mixture of burst errors and random errors can affect communication channels in a digital satellite communications system. Fading effects, jamming, or crosstalk may cause transmission errors that occur in bursts, when noise affects up to a few transmitted bytes. Random errors may result from noise that affects each transmitted digit independently.

Concatenated codes are effective against a mixture of random and burst errors in digital satellite communications. Concatenated coding introduced in 1966 implements a code with a very long block length and large error-correcting capability by utilizing multiple levels of coding. The most common approach uses inner and outer codes to provide two levels of coding. Reed-Solomon (RS) codes are used as the outer code, whereas convolutional codes may be used as the inner code. Scattered random errors in a received word are correctable by the inner code. Burst errors can then be corrected by the outer code.

Referring to FIG. 1, a digital satellite communications system 100 employing a concatenated code may comprise an outer RS encoder 2 that receives data from a data source to provide outer RS encoding. RS encoded data from the RS encoder 2 are supplied to an interleaver 4 that reorders the encoded data in a deterministic manner to enable use of a deinterleaver for spreading out error bursts in time so that errors within a code word are isolated. The interleaver 4 may be a block interleaver that formats the encoded data in a rectangular array of m rows and n columns. Each row of the array constitutes a code word of length n. The bits of the RS encoded data are read out column-wise. As a result, a burst of errors of length l=mb can be broken up into m bursts of length b. The interleaved data are supplied to an inner convolutional encoder 6 that generates convolutional coded data. The convolutional encoder 6 may be a finite-state shift register that consists of multiple k-bit stages. The input data to the convolutional encoder are shifted into and along the shift register k bits at a time to generate an output bit stream. A modulator 8 modulates the encoded data to enable data transmission over a channel 10.

At a receiver, a demodulator 12 demodulates the received data and supplies them to a Viterbi decoder 14 that provides decoding of a convolutional code. The decoder 14 implements the Viterbi algorithm, which is a maximum likelihood decoding algorithm for convolutional codes. This decoding algorithm introduced in 1967 uses the trellis structure of the code and determines the maximum-likelihood estimate of the transmitted code word that has the largest metric. The likelihood function represents the metric which can be computed for each path in the trellis. The Viterbi decoder 14 finds the path with the largest accumulated metric through the trellis in such a way that it processes the received word in an iterative manner. At each step, it compares the metrics of all paths entering each state, stores only the path with the largest accumulated metric, and discards the unlikely paths at every state, which reduces the decoding effort.

A deinterleaver 16 coupled to the Viterbi decoder 14 uses inverse permutation to restore the bit sequence reordered by the interleaver 4 to the original order. The deinterleaver 16 stores the data in the same rectangular array format as the interleaver 4. The data are read out row-wise, one code word of length n at a time.

As a result, m bursts of the code words are supplied to an outer RS decoder 18 that may implement, for example, the Berlekamp-Massey decoding algorithm to provide RS decoding. The RS decoder 18 detects errors and generates syndrome bytes $S(x)$ for each received codeword. An extended Euclidean algorithm is used to find an error location polynomial $\sigma(x)$ and error value polynomial $\eta(x)$. The Chien Search process may be implemented to find actual error locations based on the error location polynomial $\sigma(x)$.

The error value polynomial $\eta(x)$ and error locations determined based on the error location polynomial $\sigma(x)$ are used to determine an error value at each error location found by the Chien Search process. The determined error locations and values are used to correct the errors.

If the data supplied to the RS decoder 18 includes erasures, the decoder 18 performs polynomial expansion to find the erasure polynomial based on known erasure locations. Modulo polynomial multiplication is carried out to calculate modified syndrome polynomial used in regular polynomial multiplication to obtain the erasure/error location polynomial. The RS and convolutional encoding and decoding, including the Viterbi and Berlekamp-Massey decoding algorithms, are described in more detail in numerous textbooks and publications, for example, in Error Control Coding: Fundamentals and Applications, by S. Lin and D. J. Costello, Jr., Prentice-Hall, Englewood Cliffs, N.J., 1983, or Error Correcting Coding Theory, by Man Young Rhee, McGraw-Hill Publishing Company, 1989, incorporated herein by reference.

The disclosed concatenated coding arrangement may be used, for example, in a digital satellite television system that includes a transmitter for transmitting television signals to a satellite in a geosynchronous earth orbit. The satellite retransmits the received television signals to a terrestrial receiver equipped with a dish-like antenna.

Within the transmitter, analog video and audio signals are converted to respective digital signals compressed and encoded according to the Motion Picture Expert Group (MPEG) compression and encoding standard. The resultant digital signals are represented by a stream of packets including error correction data. The transmitter employs Viterbi and RS coding to form the error correction data.

The terrestrial receiver comprises Viterbi and RS decoders to decode the codewords retransmitted by the satellite. Video and audio decoders decode and decompress video and audio packets of the error corrected signals to form digital video and audio signals supplied to a TV set.

As discussed above, scattered random errors in received data are corrected by the Viterbi decoder, whereas the RS decoder corrects burst errors. The RS decoder employs a t-error correcting RS code capable of correcting any error pattern that affects t or fewer bytes. For example, for an MPEG2 format, up to 8 bytes can be corrected in an 188-byte data block. For a Digital Satellite System (DSS)

format, an RS code is able to correct 8 bytes in a 146-byte data block. It is immaterial whether one bit error exists in a corrupted byte, or a corrupted byte contains several bit errors. The error is still counted as one byte error. Thus, only t corrupted bytes may be corrected in an error correction mode. However, as well known in the art and illustrated, for example, in the S. Lin and D. J. Costello, Jr. textbook, a t-error correcting RS code is able to correct up to 2t erased bytes in an erasure correcting mode.

Therefore, to increase the error-correcting capability of a coding system, it would be desirable to provide an arrangement that allows errors to be decoded by an RS decoder in an erasure correcting mode.

DISCLOSURE OF THE INVENTION

Accordingly, one advantage of the invention is in providing an error correction arrangement that allows errors to be decoded by an RS decoder in an erasure correcting mode.

Another advantage of the invention is in increasing the error-correcting capability of a system for correcting a mixture of random and burst errors.

The above and other advantages of the invention are achieved, at least in part, by providing a system for correcting a mixture of random and burst errors, that comprises a Viterbi decoder for decoding a received codeword to correct the random errors, and a Reed-Solomon (RS) decoder responsive to a decoded word corrected by the Viterbi decoder to correct the burst errors. A score keeper is coupled to the Viterbi decoder for generating a score that indicates the number of errors in the decoded word. A tie breaker is responsive to the score for generating a flag when the score is higher than a preset threshold level. A decoding control circuit is provided for replacing the decoded word with an erasure supplied to the RS decoder when the flag is generated.

In accordance with a first aspect of the invention, the tie breaker counts the flags to generate a pass signal each time the score higher than the preset threshold level is again generated after the number of the flags has reached a predetermined value. The pass signal is supplied to the RS decoder for indicating an uncorrectable codeword. The predetermined value corresponds to the erasure-correcting capability of the RS decoder.

In accordance with another aspect of the invention, the decoding control circuit supplies the RS decoder with a word composed of all 0 bits when the flag is generated, and supplies the RS decoder with the decoded word when no flag is generated.

In accordance with a further aspect of the invention a deinterleaver is coupled between the Viterbi decoder and the RS decoder for processing the decoded word. The score is processed by the deinterleaver in synchronism with the decoded word.

In accordance with a method of the present invention, the following steps are carried out for decoding a codeword:
  determining the number of errors in a word of the codeword,
  decoding the codeword by an RS decoder in an error correction mode if the number of errors is not higher than a preset threshold level, and
  replacing the word with an erasure supplied to the RS decoder for decoding in an erasure correction mode if the number of errors is higher than the preset threshold level.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

The best mode for practicing the invention is based on the realization of a digital satellite communications system employing a concatenated code, wherein a Viterbi decoder and an RS decoder with erasure-correcting capabilities are respectively used as an inner decoder and an outer decoder. However, it is to be understood that the present invention is applicable to any decoding system having an RS decoder with erasure-correcting capabilities.

Figure 2:
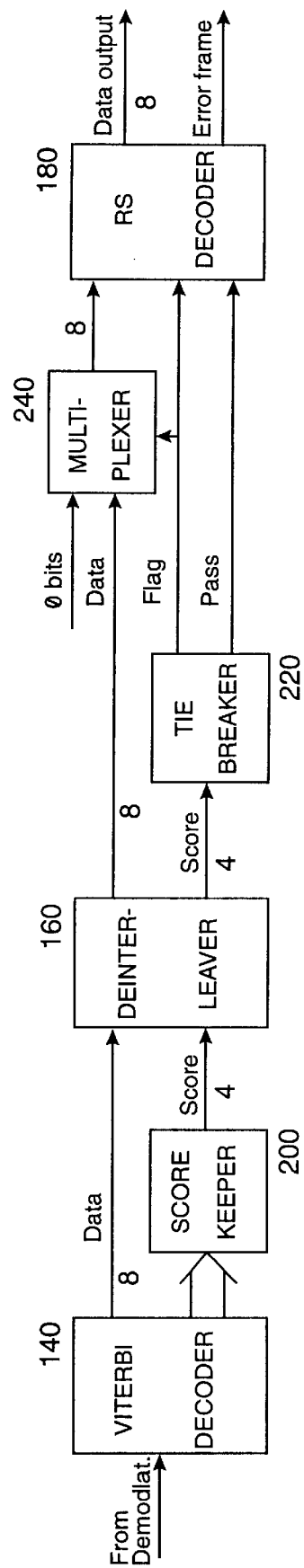
FIG. 2 is a block diagram of an error correction arrangement in a receiver of the communications system according to the present invention.

Referring to FIG. 2, a receiver in a digital satellite communications system comprises a Viterbi decoder 140 that receives a codeword from a demodulator to make a decision on each information bit in the codeword based on maximum-likelihood decoding using the Viterbi algorithm. The received codeword may vary from one 8-bit byte to 255 bytes.

Figure 3:
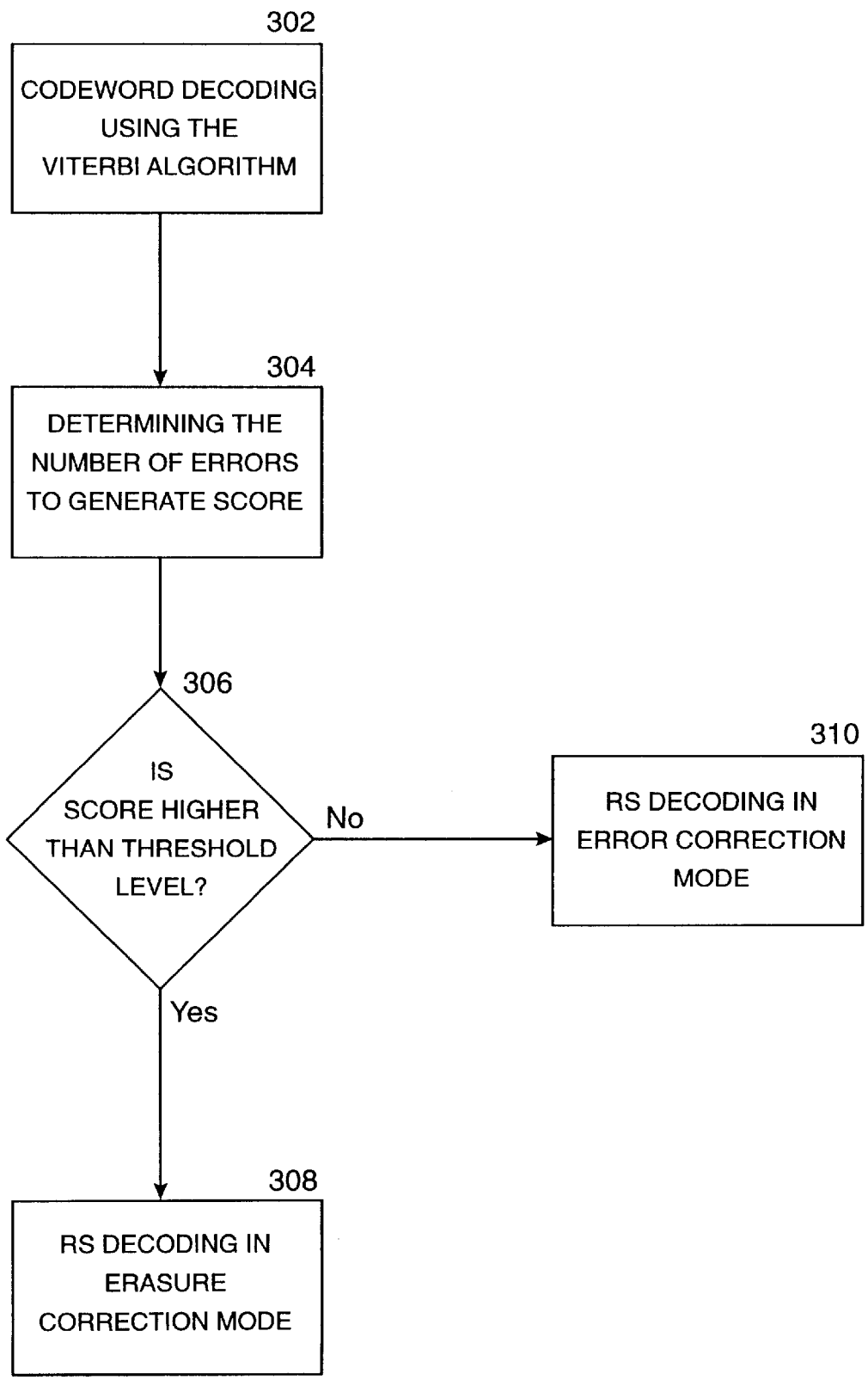
FIG. 3 is a flow chart illustrating a method of codeword decoding in accordance with the present invention.

As illustrated in FIG. 3, the Viterbi decoder 140 decodes the received codeword in accordance with the Viterbi algorithm to correct error bits (step 302), and generates a decoded sequence wherein random errors are corrected.

Figure 1:
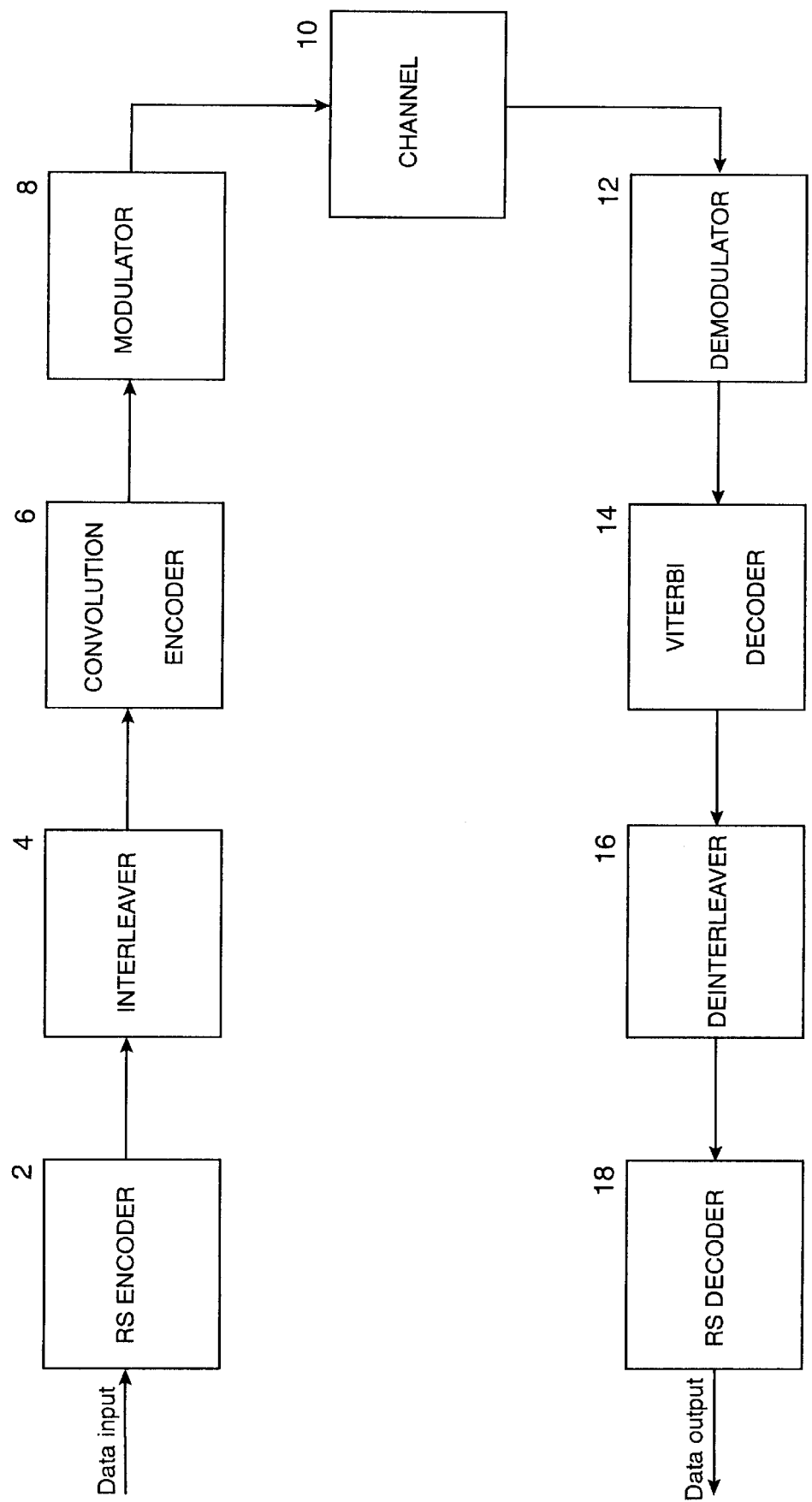
FIG. 1 is a block diagram that illustrates a digital satellite communications system employing a concatenated code.

As the Viterbi algorithm is not able to correct burst errors in the received codeword, the decoded sequence through an 8-bit data bus is supplied to a deinterleaver 160 that rearranges the data to an original order and passes it to an RS decoder 180 with erasure correcting capabilities. The operations of the Viterbi decoder 140, deinterleaver 160 and RS decoder 180 may be basically similar to the operations of the corresponding elements shown in FIG. 1.

A score keeper 200 is provided at the output of the Viterbi decoder 140 to determine the number of error bits in each decoded byte (step 304) for generating a 4-bit score that indicates the number of error bits detected in a decoded byte supplied to the deinterleaver 160. The score is processed by the deinterleaver 160 in synchronism with the corresponding decoded byte.

Through a 4-bit score bus, the deinterleaver 160 passes the score to a tie breaker 220 that compares it to a preset threshold level (step 306). If the score for a rearranged data byte supplied from the deinterleaver 160 is higher than the threshold level, the tie breaker 220 generates a flag at its output. The flag is supplied to a control input of a multiplexer 240 having a data input coupled to the 8-bit data bus to receive the corresponding rearranged data byte from the deinterleaver 160, and an erasure input supplied with all 0 bits. Via the 8-bit bus, the output of the multiplexer 240 is coupled to the RS decoder 180.

When the flag is generated, a data byte having a score higher than the threshold level is prevented from passing to the output of the multiplexer 240. Instead, an 8-bit packet of all 0 bits that imitates an erased byte is supplied from the multiplexer 240 to the RS decoder 180 to be decoded in an erasure correction mode using, for example, Berlekamp-Massey decoding algorithm (step 308). Also, the flag is fed to the RS decoder 180 to indicate the location of the erased byte in the received codeword.

In the erasure correction mode, the RS decoder 180 performs polynomial expansion to find an erasure polynomial based on known erasure locations. Modulo polynomial multiplication is carried out to calculate a modified syndrome polynomial. Then, regular polynomial multiplication is performed to obtain an erasure/error location polynomial used to correct the erasure.

As discussed above, if a t-error correcting RS code is employed, the RS decoder 180 is not able to correct more than 2t erased bytes. To prevent an excessive number of erasures from being supplied to the RS decoder 180, the tie breaker 220 counts the number of generated flags. When it detects that 2t flags are generated, the flag output is locked to prevent more than 2t flags from passing to the multiplexer 240. Accordingly, only 2t erased bytes or fewer are allowed to be processed by the RS decoder 180. After detecting 2t flags, the tie breaker 220 generates a pass signal each time a score higher that the preset threshold level is supplied from the deinterleaver 160. The pass signal is provided to the RS decoder 180 to indicate that the codeword is uncorrectable.

If a score for a rearranged data byte supplied from the deinterleaver 160 does not exceed the preset threshold level, the tie breaker 220 generates no flag, and the corresponding data byte is able to pass the multiplexer 240 to be decoded by the RS decoder 180 in the error correction mode (step 310).

The RS decoder 180 outputs an 8-bit decoded data packet together with a 1-bit error frame that indicates whether or not the decoded data contain uncorrected errors. For example, the error frame may show that errors are present in the decoded data when the pass signal is supplied to the RS decoder 180.

There accordingly has been described an error correction arrangement that contains a Viterbi decoder and an RS decoder to provide inner and outer code decoding, respectively. A score keeper is arranged at the output of the Viterbi decoder to form a score for a decoded byte to indicate the number of error bits in the byte. A tie breaker is provided to compare the score with a preset threshold level. If the score is higher than the threshold level, the corresponding error byte is replaced with an erasure supplied to the RS decoder. Inasmuch as the RS decoder is capable of correcting twice as many erasures as errors, the error correcting capability of the error correction arrangement is doubled.

In this disclosure, there are shown and described only the preferred embodiments of the invention, but it is to be understood that the invention is capable of changes and modifications within the scope of the inventive concept as expressed herein.

I claim:

1. A system for correcting a mixture of random errors and burst errors, comprising:
   a Viterbi decoder for decoding a received codeword to correct the random errors;
   a Reed-Solomon (RS) decoder responsive to a decoded word corrected by said Viterbi decoder to correct the burst errors;
   a score keeper coupled to said Viterbi decoder for generating a score that indicates the number of errors detected in said decoded word;
   a tie breaker responsive to said score for generating a flag when said score is higher than a preset threshold level; and
   a decoding control circuit responsive to said flag for replacing said decoded word with an erasure supplied to said RS decoder.

2. The system of claim 1, wherein said tie breaker counts the flags to generate a pass signal each time the score higher than said preset threshold level is generated, if the number of said flags reaches a predetermined value.

3. The system of claim 2, wherein said pass signal is supplied to said RS decoder for indicating an uncorrectable codeword.

4. The system of claim 2, wherein said predetermined value corresponds to erasure-correcting capability of said RS decoder.

5. The system of claim 1, wherein said decoding control circuit supplies said RS decoder with a word composed of all 0 bits when said flag is generated, and supplies said RS decoder with said decoded word when no flag is generated.

6. The system of claim 1, further comprising a deinterleaver coupled between said Viterbi decoder and said RS decoder for processing said decoded word.

7. The system of claim 1, wherein said score is processed by said deinterleaver in synchronism with said decoded word.

8. The system of claim 1, wherein said RS decoder decodes said decoded word in an error correction mode, and decodes said erasure in an erasure correction mode.

9. In an error correction system, a method of decoding a codeword comprising the steps of:
   determining the number of errors detected in a word of said codeword;
   decoding said codeword by an RS decoder in an error correction mode if said number is not higher than a preset threshold level; and
   replacing said word with an erasure supplied to said RS decoder for decoding in an erasure correction mode if said number is higher than said preset threshold level.

10. The method of claim 9, further comprising decoding said codeword in accordance with the Viterbi decoding algorithm, before said step of determining the number of errors.

11. A digital satellite television system comprising:
   a transmitter for generating a stream of digital packets representing video and audio signals, said transmitter having first and second encoders for generating error correction data included in said packets;
   a satellite for receiving and retransmitting said stream of digital packets; and
   a receiver for receiving said stream of digital packets retransmitted by said satellite and generating said video and audio signals to be supplied to a TV set,
   said receiver including:
      first and second decoders for decoding the error correction data provided by said first and second encoders;
      an error detection circuit for determining the number of errors detected in a word decoded by said first decoder; and
      a decoding control circuit for replacing the decoded word with an erasure supplied to said second decoder if said number of errors exceeds a preset threshold level.

12. The system of claim 11, wherein said second decoder comprises an RS decoder for decoding RS data received from said transmitter.

13. The system of claim 12, wherein said first decoder comprises a Viterbi decoder for decoding a convolutional code received from said transmitter.

14. The system of claim 13, wherein said RS decoder further decodes the word decoded by said Viterbi decoder if said number of errors does not exceed the preset threshold level.

15. The system of claim 14, wherein said receiver further comprises a tie breaker for generating decoding control signals.

16. The system of claim 15, wherein said tie breaker counts the number of the decoded words having the number of errors higher than said preset threshold level to generate a pass signal supplied to said RS decoder each time the number of errors higher than said preset threshold level is detected, if said number of the decoded words exceeds a predetermined value.

17. The system of claim 16, wherein said tie breaker prevents said decoding control circuit from replacing the decoded word with an erasure, if said number of the decoded words having the number of errors higher than said preset threshold level exceeds said predetermined value.

18. The system of claim 17, wherein said predetermined value corresponds to erasure-correcting capability of said RS decoder.

19. The system of claim 18, wherein said decoding control circuit comprises a multiplexer for supplying said RS decoder with a word composed of all 0 bits when the number of errors higher than said preset threshold level is detected, if said number of the decoded words does not exceed said predetermined value.

20. The system of claim 19, wherein said multiplexer supplies said RS decoder with said decoded word when the detected number of errors does not exceed said preset threshold level.

* * * * *